(12) United States Patent
Hidese

(10) Patent No.: US 6,606,790 B2
(45) Date of Patent: Aug. 19, 2003

(54) COMPONENT MOUNTER AND MOUNTING METHOD

(75) Inventor: Wataru Hidese, Fukuoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 132 days.

(21) Appl. No.: 09/885,887

(22) Filed: Jun. 20, 2001

(65) Prior Publication Data

US 2002/0053134 A1 May 9, 2002

(30) Foreign Application Priority Data

| Jun. 21, 2000 | (JP) | ................................... | 2000-185847 |
| Jun. 21, 2000 | (JP) | ................................... | 2000-185848 |
| Jun. 21, 2000 | (JP) | ................................... | 2000-185851 |

(51) Int. Cl.[7] ................................................. H05K 3/30
(52) U.S. Cl. ............................ 29/832; 29/705; 29/740; 29/833
(58) Field of Search .......................... 29/833, 832, 740, 29/33 M, 705

(56) References Cited

U.S. PATENT DOCUMENTS

| 5,377,405 A | * | 1/1995 | Sakurai et al. |
| 5,491,888 A | * | 2/1996 | Sakurai et al. |
| 5,566,447 A | * | 10/1996 | Sakurai |
| 5,619,328 A | * | 4/1997 | Sakurai |
| 5,839,186 A | * | 11/1998 | Onodera |
| 5,864,944 A | * | 2/1999 | Kahiwagi et al. |
| 6,148,511 A | * | 11/2000 | Taguchi |
| 6,154,957 A | * | 12/2000 | Tsubouchi et al. |
| 6,216,336 B1 | * | 4/2001 | Mitsushima et al. |
| 6,308,403 B1 | * | 10/2001 | Hwang |
| 6,370,764 B1 | * | 4/2002 | Kinoshita et al. |
| 6,446,333 B1 | * | 9/2002 | Kashiwagi et al. |
| 6,466,837 B1 | * | 10/2002 | Mimura et al. |

FOREIGN PATENT DOCUMENTS

| JP | 05-15495 | 2/1993 |

* cited by examiner

Primary Examiner—Carl J. Arbes
(74) Attorney, Agent, or Firm—RatnerPrestia

(57) ABSTRACT

A component mounter which picks up components from two or more tape feeders aligned in a component feeder carriage, and mounts them a board. Suction nozzles for vacuum-holding components are disposed on the transfer head at a predetermined basic pitch in the X direction (tape feeders alignment direction) to form a nozzle line. Two or more nozzle lines are aligned in the Y direction (perpendicular to the X direction). These suction nozzles pick up two or more components from the tape feeders simultaneously, enabling to reduce the space required for installing the mounter and making the mounter more compact. Increased feasibility of simultaneous pickup of several components also improves mounting efficiency.

7 Claims, 10 Drawing Sheets

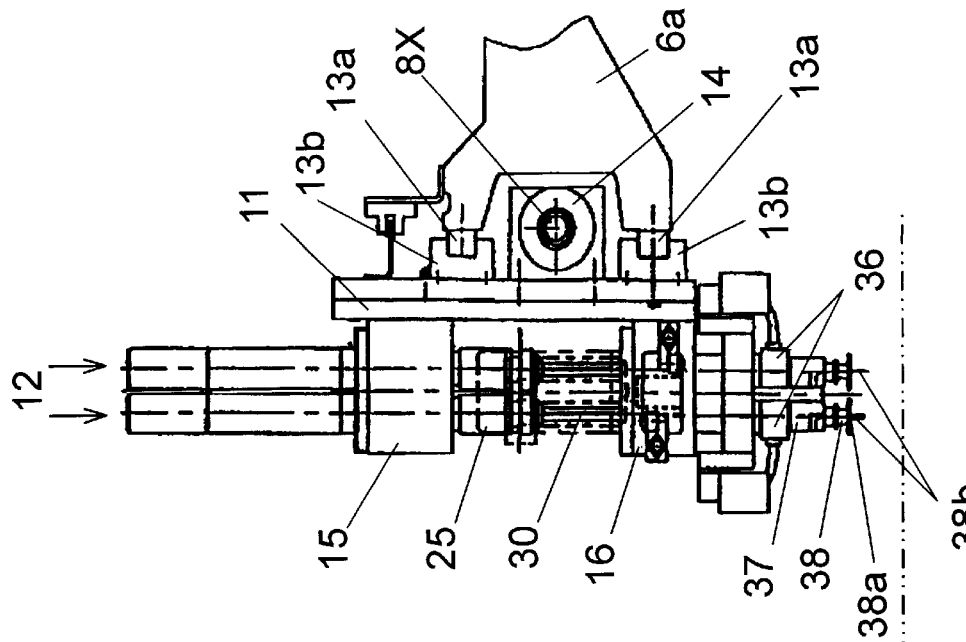
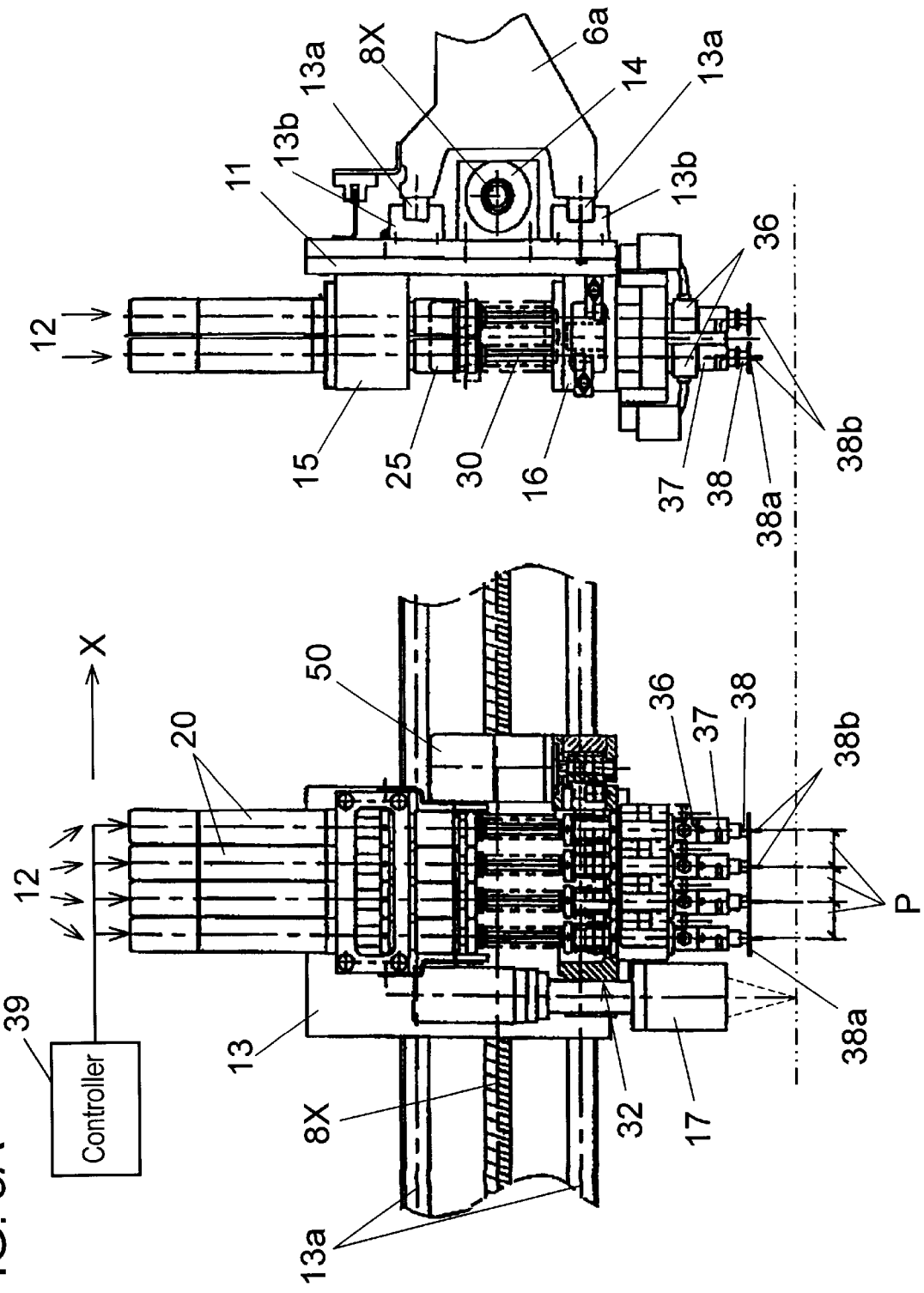
FIG. 3A
FIG. 3B

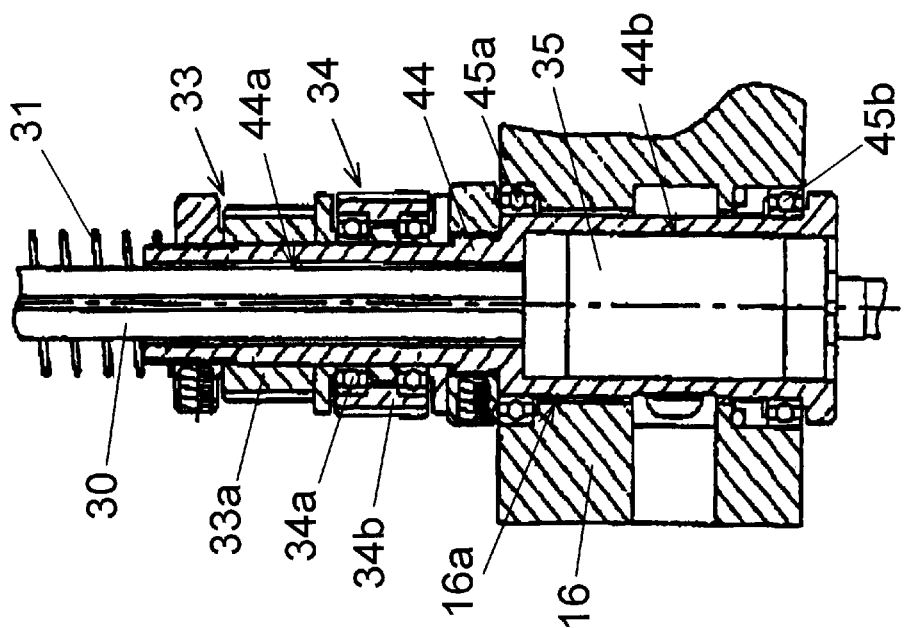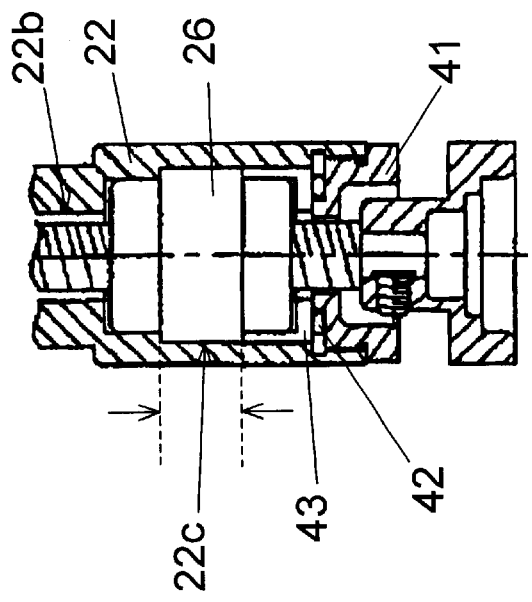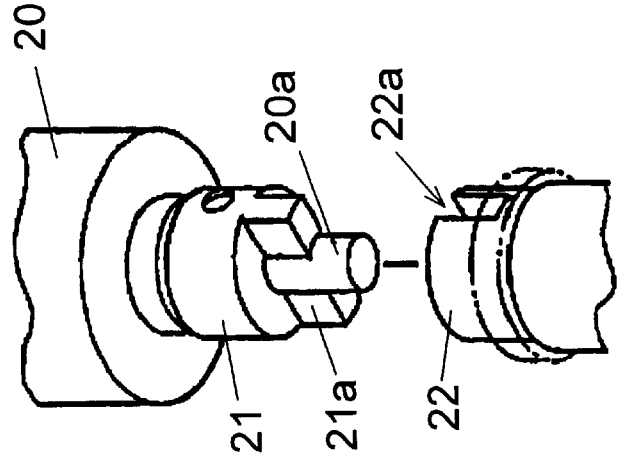

FIG. 9A
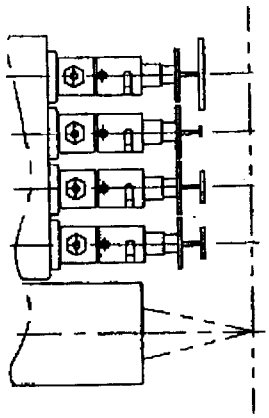
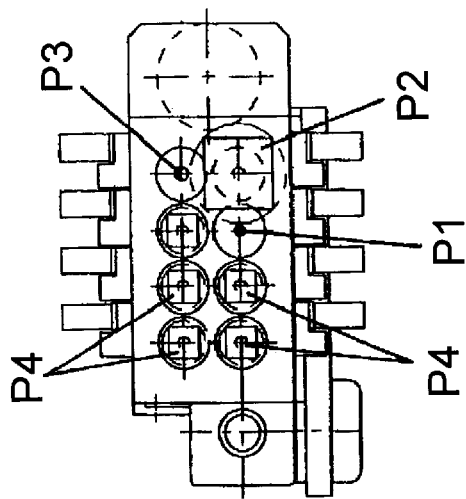
FIG. 9B
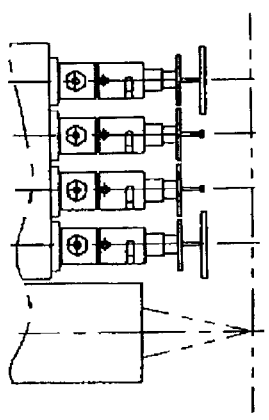
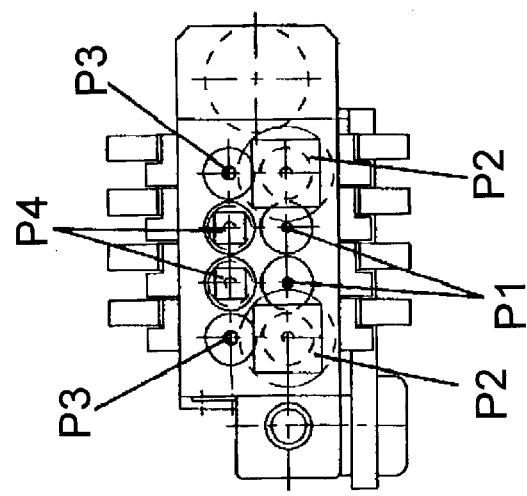
FIG. 9C
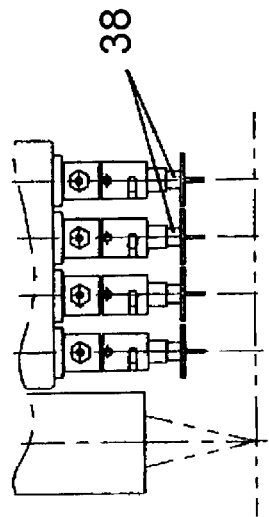
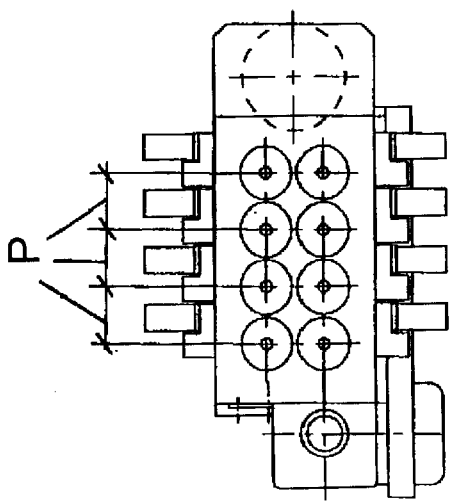

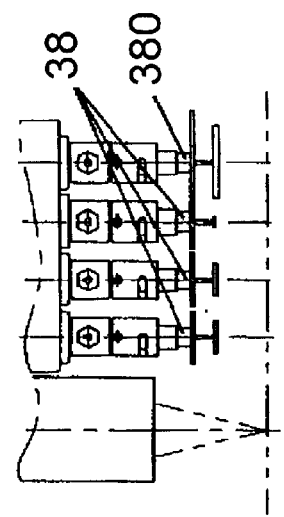
FIG. 10C
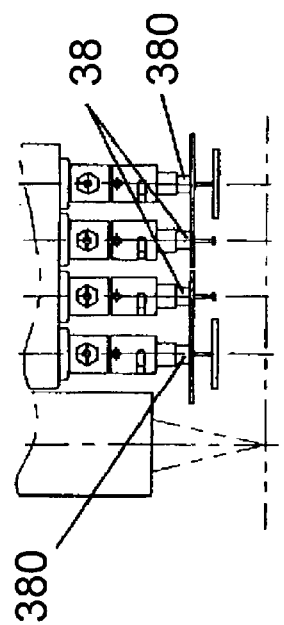
FIG. 10B
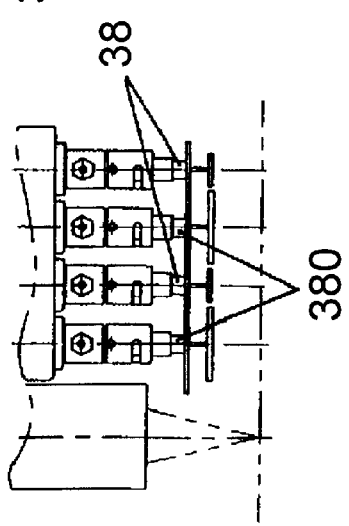
FIG. 10A
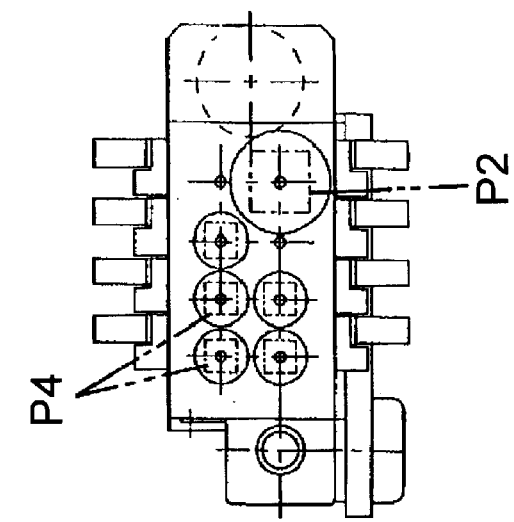
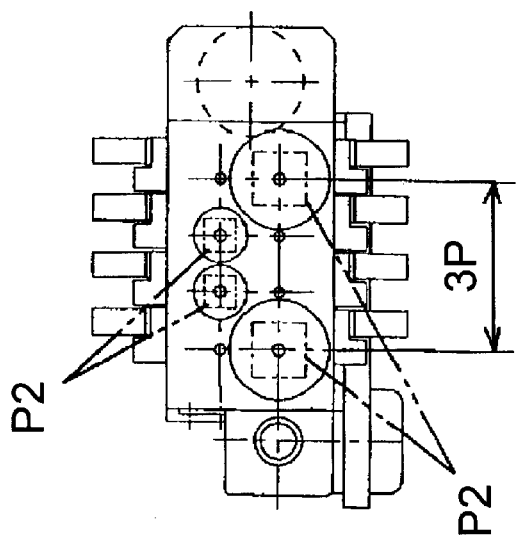
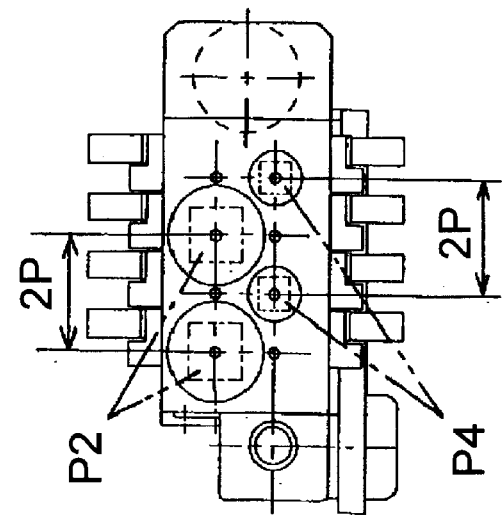

COMPONENT MOUNTER AND MOUNTING METHOD

FIELD OF THE INVENTION

The present invention relates to component mounters and mounting methods for mounting, for example, electronic components on a board.

BACKGROUND OF THE INVENTION

A component mounter for mounting electronic components such as semiconductors on a board is equipped with a component feeder carriage in which numerous parts feeders such as tape feeders for storing components are aligned.

The component mounter repeats the mounting operation of picking up components from these parts feeders using its transfer head, and placing them on the board. In order to improve the efficiency of this mounting operation, multi-nozzle transfer head, in which two or more suction nozzles for holding components are aligned, is often used. Conventional alignment of suction nozzles in the multi-nozzle transfer head includes the series nozzle type, in which two or more suction nozzles are aligned linearly in a single line; and the rotary type in which two or more suction nozzles are disposed circumferentially.

The mounting operation takes place by moving the transfer head by using a moving device such as an XY table. However, the moving shafts composing the XY table incorporate mechanical error caused by pitch error of the ball screw.

Accordingly, the move command value for each shaft from the controller does not always result in the actual position being attained. Positional deviation specific to each point on the board exists. The mounter thus executes calibration for identifying the positional deviation specific to each mounting point on the board in advance to compensate for the deviation. More specifically, a board recognition camera captures an image of a calibration board in which calibration measuring points are provided on a grid at the time of machine startup and maintenance. The position of each measuring point detected by capturing the image is compared with the position in the control data for identifying the dislocation unique to each mounting point. During the actual mounting operation, the moving device is driven while compensating for the identified dislocation.

However, a conventional transfer head as described above has the following disadvantages in mounter structure and mounting efficiency.

First, the series nozzle type requires greater alignment length with increasing number of nozzles. This leads to a longer horizontal movement stroke for moving the transfer head within the mounter, increasing machine space and costs. In addition, a larger number of nozzles unavoidably results in buildup of pitch error between suction nozzles. Larger pitch error causes more frequent suction errors while vacuum-holding two or more components picked up at the same time from the component feeder carriage (multiple parts feeders) by two or more suction nozzles. The resulting failure of simultaneous component pickup may reduce mounting efficiency. This lower feasibility of simultaneous pickup is also a disadvantage of the rotary transfer head.

Second, many different types of components are mounted on the same board, and shapes and sizes also differ. Accordingly, the suction nozzle which vacuum-holds and picks up these components need to be designed to pick up specific types of components. However, it is difficult to efficiently dispose two or more suction nozzles for components with different sizes and shapes in a conventional multi-nozzle transfer head. This restricts the types of components that can be mounted using the same mounter, impeding the improvement of mounting efficiency.

Third, a multi-nozzle transfer head also requires the aforementioned calibration process. However, a complete set of calibration data may not be obtainable depending on where the camera is positioned on the series nozzle transfer head when the board recognition camera installed in the series nozzle transfer head is used for calibration.

SUMMARY OF THE INVENTION

The present invention aims to offer a space-saving and compact component mounter and mounting method which allows to increase the mounting efficiency by improving the feasibility of simultaneous pickup of several components.

The present invention also aims to offer a component mounter and mounting method that enables processing of highly precise calibration data by appropriately placing a board recognition camera with respect to a transfer head to which two or more nozzles are provided.

The present invention further aims to offer a component mounter and mounting method which improves the mounting efficiency by broadening the types of applicable components.

The component mounter of the present invention includes:

(a) a plurality of parts feeders aligned in a component feeder carriage; and (b) a transfer head for picking up components from the parts feeders and mounting them on a board. The transfer head has two or more suction nozzles for vacuum-holding components.

Suction nozzles are aligned at a predetermined basic pitch, alongside the setting direction of the parts feeders, in two or more lines.

This configuration allows to make the mounter smaller, and also achieves more efficient component mounting by improving the feasibility of simultaneous pickup of several components.

Another component mounter of the present invention includes:

(a) a plurality of parts feeders aligned in a component feeder carriage; and (b) a transfer head for picking up components from the parts feeders and mounting them on a board. The transfer head has two or more suction nozzles for vacuum-holding components.

The suction nozzles are of different sizes, and they are aligned at a predetermined basic pitch and/or simple multiple of basic pitch, alongside the setting direction of the parts feeders, in two or more lines.

This configuration broadens the types of applicable components using the same mounter, increasing the component mounting efficiency.

The component mounting method of the present invention includes the step of simultaneously picking up two or more components from the parts feeders using a transfer head of a mounter described next.

The mounter for implementing the mounting method of the present invention includes a plurality of parts feeders aligned in a feeder carriage; and a transfer head for picking up components from the parts feeders and mounting them on a board. The transfer head has two or more suction nozzles for vacuum-holding components.

The suction nozzles are aligned at a predetermined basic pitch, alongside the setting direction of the parts feeders, in two or more lines. The nozzle lines are aligned perpendicular to the alignment direction of nozzles in each nozzle line.

This method enables to save machine installation space and make the mounter more compact. At the same time, components can be mounted with better efficiency by improving the feasibility of simultaneous pickup of two or more components.

Another component mounting method of the present invention relates to the process of picking up components from two or more parts feeders aligned in the component feeder carriage by using the transfer head.

The above transfer head has two or more nozzles for vacuum-holding components, and these nozzles are aligned at a predetermined basic pitch, alongside the parts feeders, in two or more lines.

The mounting method of the present invention includes the next steps.

(a) Capturing of an image of a calibration board using a camera which is disposed approximately in line with a nozzle line at the component feeder carriage side in several nozzle lines, or at nearer to the head attachment base side from the nozzle line. The camera integrally moves with the transfer head by a moving device for moving the transfer head.

(b) Processing of calibration data for the moving device based on image capturing results.

The above method enables to capture images in the entire calibration area.

Another component mounting method of the present invention also relates to the process of picking up components from two or more parts feeders aligned in the component feeder carriage and mounting them on a board by using the transfer head.

The above transfer head for implementing the mounting method of the present invention has two ore more suction nozzles with different sizes for vacuum-holding components. These nozzles are aligned at a predetermined basic pitch and/or an simple multiple of basic pitch, alongside the parts feeders, in two or more lines.

The mounting method of the present invention includes the step of picking up several components with different sizes using this transfer head.

This method broadens the types of applicable components using the same mounter, improving the component mounting efficiency.

BRIEF DESCRIPTION OF THE DRAWINGS

FIG. 3A is a front view of the transfer head shown in FIG. 2.

FIG. 3B is a side view of the transfer head shown in FIG. 2.

FIGS. 5A to 5C are fragmentary details of the suction nozzle unit shown in FIG. 4.

FIGS. 9A to 9C and FIGS. 10A to 10C illustrate nozzle alignment of the transfer head of the component mounter in accordance with the preferred embodiment of the present invention.

DETAILED DESCRIPTION OF THE INVENTION

A preferred embodiment of the present invention is described below with reference to drawings.

Figure 1:
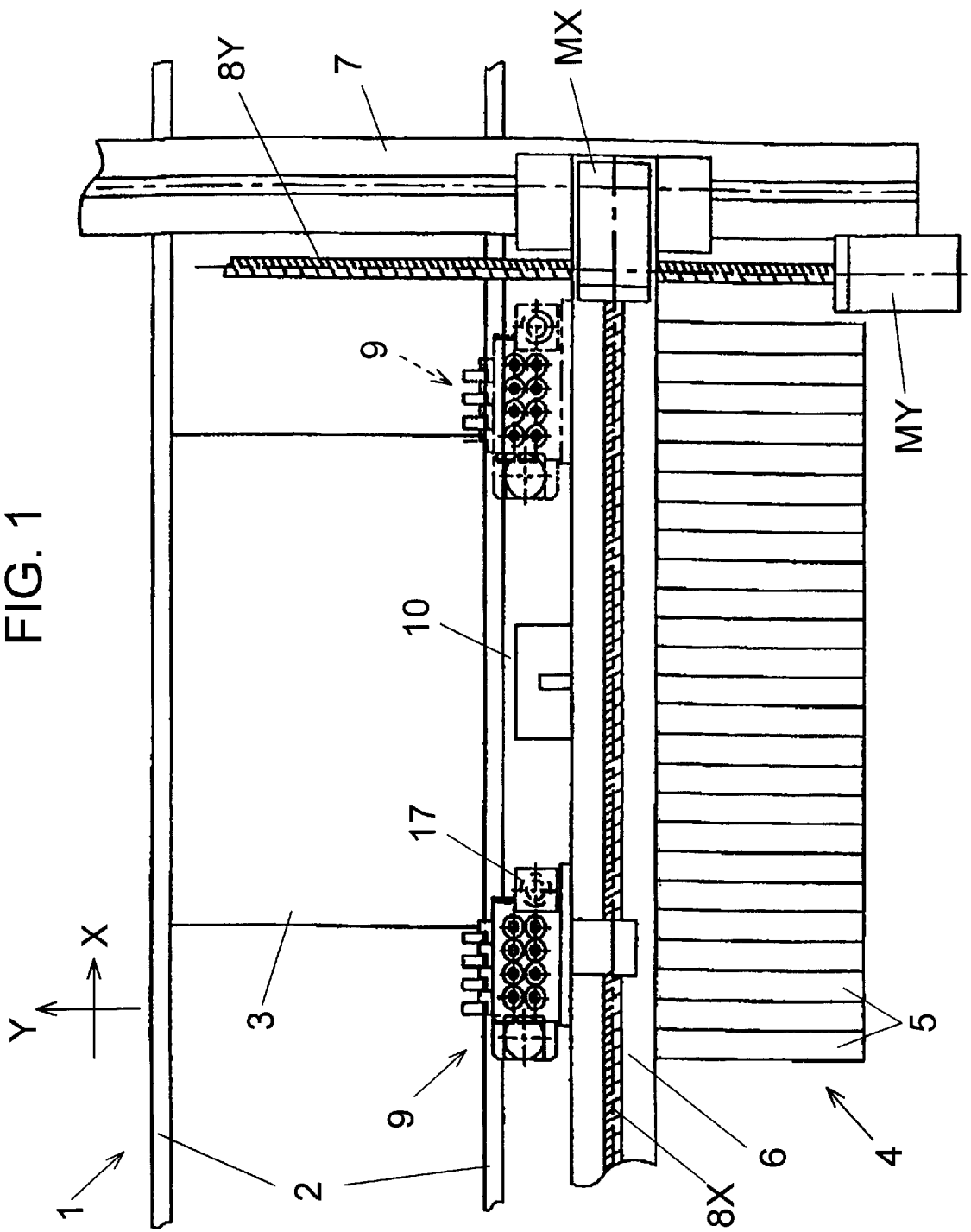
FIG. 1 is a plan view of a component mounter in accordance with a preferred embodiment of the present invention.

FIG. 1 is a plan view of a component mounter in the preferred embodiment of the present invention.

First, the overall structure of the component mounter is described with reference to FIG. 1.

In FIG. 1, rail 2 is provided on component mounter 1. Rail 2 transports and positions board 3 onto which components are mounted. Component feeder carriage 4 is disposed at the side of rail 2. Tape feeders 5, which are multiple parts feeders, are set parallel to each other in feeder carriage 4.

X-axis table (X table) 6 and Y-axis table (Y table) 7 are disposed over feeder carriage 4 and rail 2. X table 6 is equipped with feeding screw 8X and driving motor "MX." Y table 7 is equipped with feeding screw 8Y and driving motor "MY." X table 6 moves in the Y direction when Y motor "MY" is driven, and Y table 7 moves in the X direction when X motor "MX" is driven. Transfer head 9 is attached to X table 6. This head 9 picks up a component from tape feeder 5 in feeder carriage 4, transfers it to and mounts it on board 3 positioned on rail 2. X table 6 and Y table 7 are thus a moving device for horizontally moving head 9.

Line camera 10 for recognizing components is disposed between rail 2 and feeder carriage 4. Camera 10 captures the image of a component from beneath when head 9 passes over camera 10 after picking up the component from feeder carriage 4. The component is recognized by processing the image data obtained. In other words, camera 10 is a recognition device for identifying the component held by a suction nozzle of head 9 from underneath.

Next, transfer head 9 is detailed with reference to FIGS. 2, 3A, and 3B.

Figure 2:
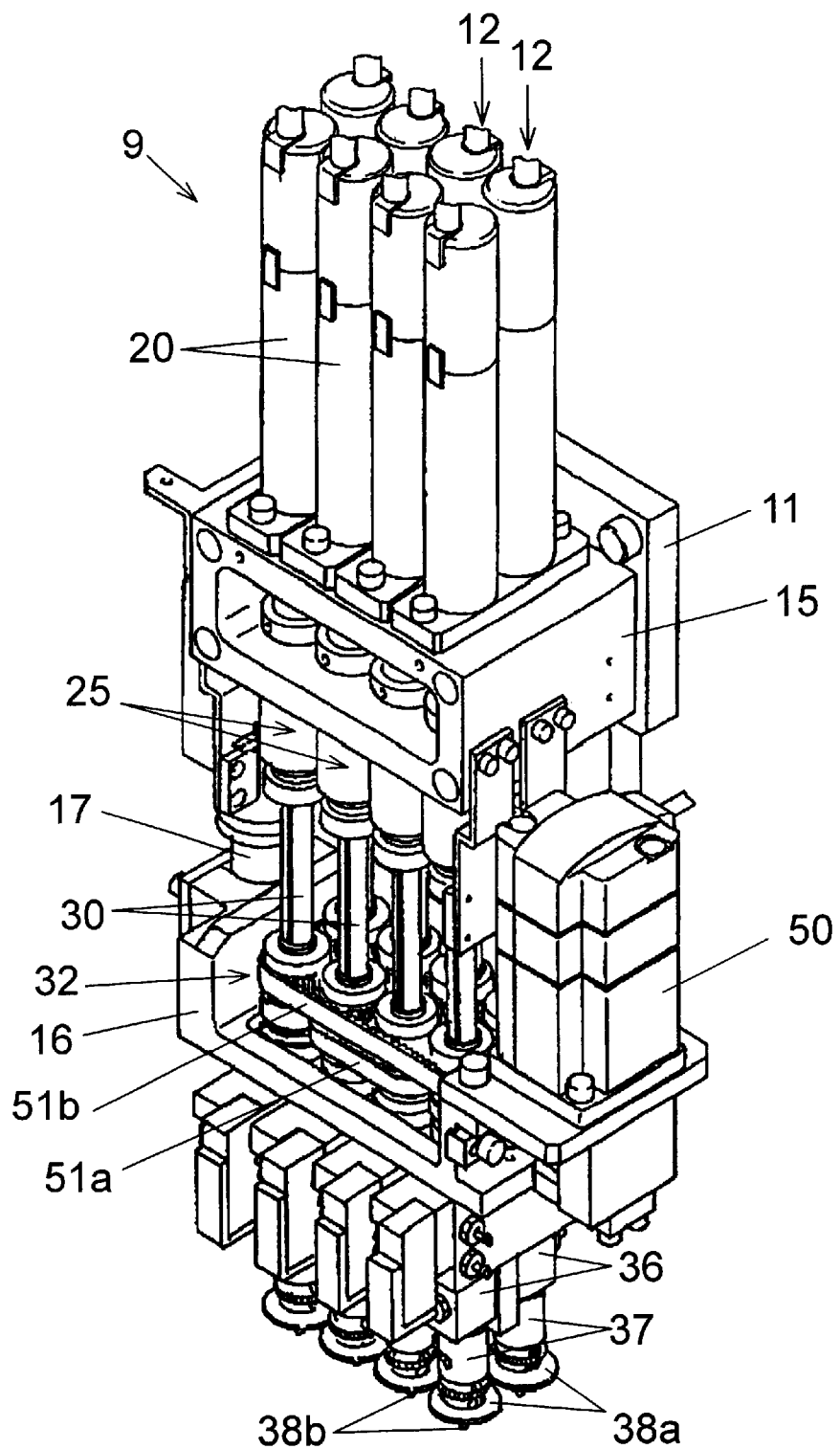
FIG. 2 is a perspective view of a transfer head of the component mounter shown in FIG. 1.

FIG. 2 is a perspective view of the transfer head of the component mounter shown in FIG. 1; FIG. 3A is a front view; and FIG. 3B is a side view of the transfer head shown in FIG. 2.

As shown in FIGS. 2, 3A and 3B, transfer head 9 is a series nozzle head in which two or more nozzles move integrally. More specifically, head 9 is configured with several suction nozzle units 12 disposed on upright common base 11. Each unit 12 consists of a suction nozzle integrated with an elevation mechanism and vacuum mechanism. The preferred embodiment shown in FIG. 2 has two nozzle lines aligned in the Y direction indicated in FIG. 1. Each nozzle line consists of four units 12 aligned along the X direction (tape feeder setting direction) shown in FIG. 1.

This placement of units 12 enables a significant reduction in the travel of the transfer head in the X direction, compared to a conventional series-nozzle transfer head in which multiple suction nozzles are aligned in series in a single line. The space required for equipment can thus be reduced since the stroke of the transfer head in the X direction is shortened. In addition, since the number of nozzles aligned in series is fewer, the cumulative pitch error between the nozzles is suppressed. This reduces defects caused by positional deviation when simultaneously picking up several components.

As shown in FIGS. 3A and 3B, guide rail 13a is horizontally disposed at the side face of frame 6a of X table 6. Slider 13b slidably fitted to guide rail 13a is fixed to base 11. Nut 14 which screws onto feeding screw 8X is also fixed to base 11. Base 11 horizontally moves in the X direction as feeding screw 8X rotates, driven by X motor "MX." Accordingly, this horizontal movement of base 11 integrally moves units 12.

Next, the structure of head 9 is described. Upper frame 15 and lower frame 16 are secured on the side face of base 11. Nozzle elevation motor 20 composing suction nozzle unit 12 is vertically disposed on the top face of upper frame 15. Rotation of motor 20 is transmitted to elevation mechanism 25 provided under upper frame 15. Here, rotation of motor 20 is converted to vertical movement of elevation shaft 30. Controller 39 controls each motor 20 separately for individually adjusting the elevation stroke of each suction nozzle in head 9.

Accordingly, since the stroke for elevating and lowering each suction nozzle may be adjusted separately in head 9 having multiple suction nozzles, there is no need to raise and lower the entire head 9. This enables the reduction of the driving load on the elevation mechanism, compared to the conventional elevation mechanism for the entire transfer head. In addition, elevation of each suction nozzle during the mounting operation may be conducted only by operating respective driving system. As a result, the overall mounting tact time may be reduced.

Shaft rotor 32 is provided for elevation shaft 30. Rotation is transmitted from nozzle rotation motor 50 fixed to lower frame 16 through endless belts 51a and 51b to shaft rotor 32. This makes elevation shaft 30 rotate on the shaft. The lower end of elevation shaft 30 is connected to nozzle head 37 by inserting it through swivel section 36. Suction tool 38 with light reflector 38a and suction tip 38b is detachably disposed on nozzle head 37. In other words, suction tool 38 is disposed on the lower end of elevation shaft 30.

Swivel section 36 is connected to a vacuuming device (not illustrated). Vacuum suction is applied at the lower end of suction tip 38b by vacuuming at swivel section 36, while allowing suction tool 38 to rotate on the shaft. Suction tool 38 vacuum-holds a component by transmitting the vacuum present in swivel section 36 when the lower end of suction end 38b contacts the component. Reflector 38a reflects the light emitted from underneath to illuminate the component held by suction tip 38b when line camera 10 captures an image.

Figure 4:
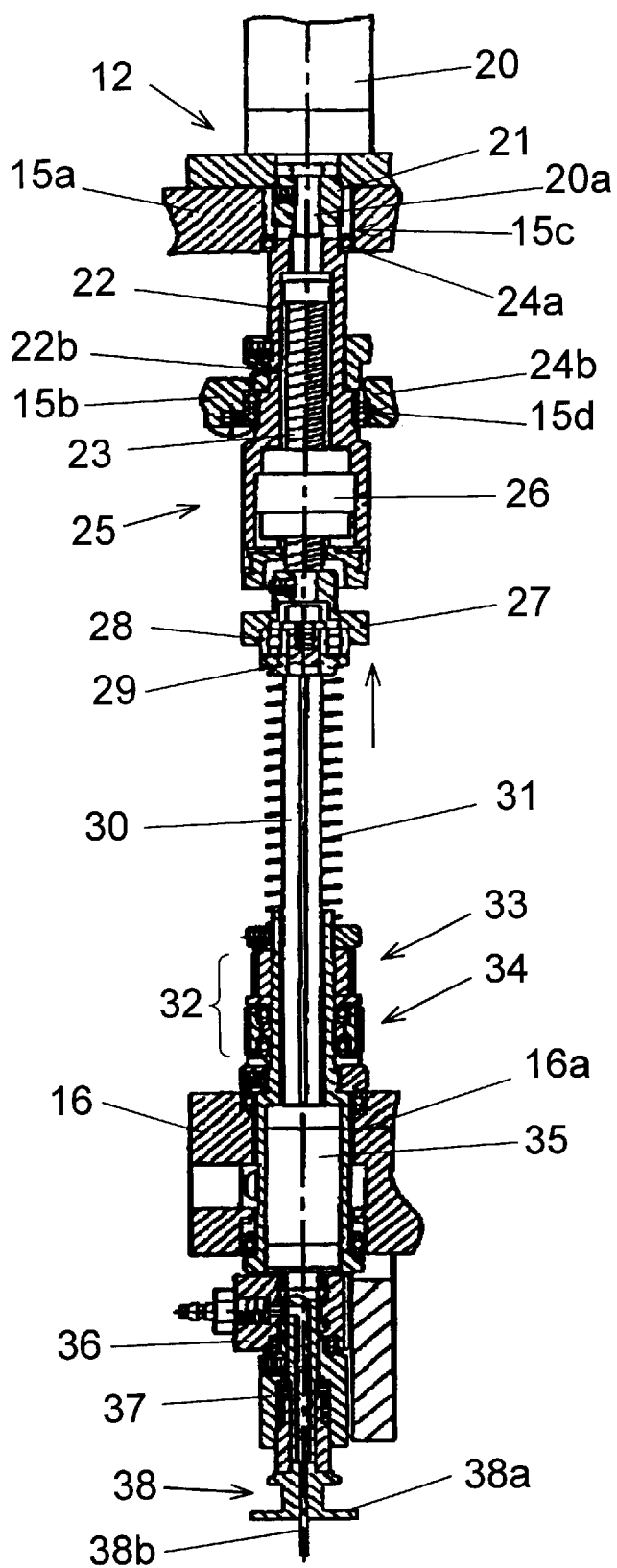
FIG. 4 is a sectional view of a suction nozzle unit of the component mounter shown in FIG. 1.

The structure of suction nozzle unit 12 is described with reference to FIGS. 4, 5A to 5C. FIG. 4 is a sectional view of the suction nozzle unit of the component mounter shown in FIG. 1. FIGS. 5A to 5C are fragmentary details of the suction nozzle unit shown in FIG. 4.

In FIG. 4, shaft hole 15c is provided on top plate 15a of upper frame 15 for inserting rotation shaft 20a of nozzle elevation motor 20 in the way described next. Coupler 21 is attached to shaft 20a. Shaft 20a, on which coupler 21 is disposed, is inserted into shaft hole 15c. Bearings 24a and 24b are respectively attached to shaft hole 15c and shaft hole 15d provided on bottom plate 15b of upper frame 15. These bearings journal housing 22 of elevation mechanism 25. As shown in FIG. 5A, slit 22a is provided on the upper end of housing 22. Flat teeth 21a of coupler 21 are fitted to slit 22a. This structure enables housing 22 to rotate in response when motor shaft 20a rotates.

As shown in FIG. 5B, inner hole 22b, which is a vertical through hole, is provided on housing 22. The lower part of inner hole 22b leads to attachment hole 22c to which nut 26 is fitted. Nut 26 is fitted into attachment hole 22c, and collar plate 43 is retained by retainer 41 with elastic ring 42 in between. This allows nut 26 to be sandwiched inside the stepped portion indicated by an arrow in FIG. 5B, and is thus secured in housing 22.

As shown in FIG. 4, feeding screw 23 inserted through inner hole 22b is screwed into nut 26. The bottom part of feeding screw 23 is rotatably attached to elevation mechanism 30 through retainers 27 and 29 vertically holding bearing 28. Accordingly, nut 26 fixed to housing 22 rotates when nozzle elevation motor 20 is driven. In other words, nozzle elevation motor 20 is a driving device for rotating nut 26. Feeding screw 23 moves vertically as a result of the rotation of nut 26. This vertical movement of feeding screw 23 is transmitted to elevation shaft 30 which is connected to feeding screw 23, and both feeding screw 23 and elevation shaft 30 rise. At this point, elevation shaft 30 is allowed to relatively rotate with respect to feeding screw 23 via bearing 28. Spring 31 is attached to the circumference of elevation shaft 30. This spring 31 contacts retainer 29 to transmit a spring force upwards. This spring force is further transmitted to feeding screw 23 through retainer 27. Accordingly, feeding screw 23 is pressed against nut 26 in the shaft direction when nut 26 rotates to move feeding screw 23 vertically. This prevents feeding screw 23 from rotating together with nut 26. In other words, spring 31 functions as a brake that prevents co-rotation of feeding screw 23.

As shown in FIG. 5C, bearings 45a and 45b are attached to shaft hole 16a provided on lower frame 16. These bearings 45a and 45b journal housing 44. Inner hole 44a, which is a vertical through hole, is provided on housing 44. Slide guide 35 is fitted to attachment hole 44b provided in a lower part of inner hole 44a. Elevation shaft 30 is inserted through slide guide 35 so as displacement in the rotation direction is suppressed. In other words, elevation shaft 30 rotates together when housing 44 rotates.

The upper part of housing 44 is shaft rotor 32 (FIG. 4) to which rotation is transmitted from nozzle rotation motor 50. Transmission pulley section 33 and idler pulley section 34 are provided to shaft rotor 32. Transmission pulley section 33 is equipped with pulley 33a fixed onto housing 44. Rotation is transmitted to housing 44 by endless belt 51a (FIG. 2) on pulley 33a.

On the other hand, pulley 34b provided to idler pulley section 34 is attached to housing 44 through bearing 34a. Accordingly, endless belt 51b (FIG. 2) on idler pulley 34 does not transmit rotation to housing 44. In other words, idler pulley section 34 functions only as an idler simply guiding belt 51b.

Figure 6A:
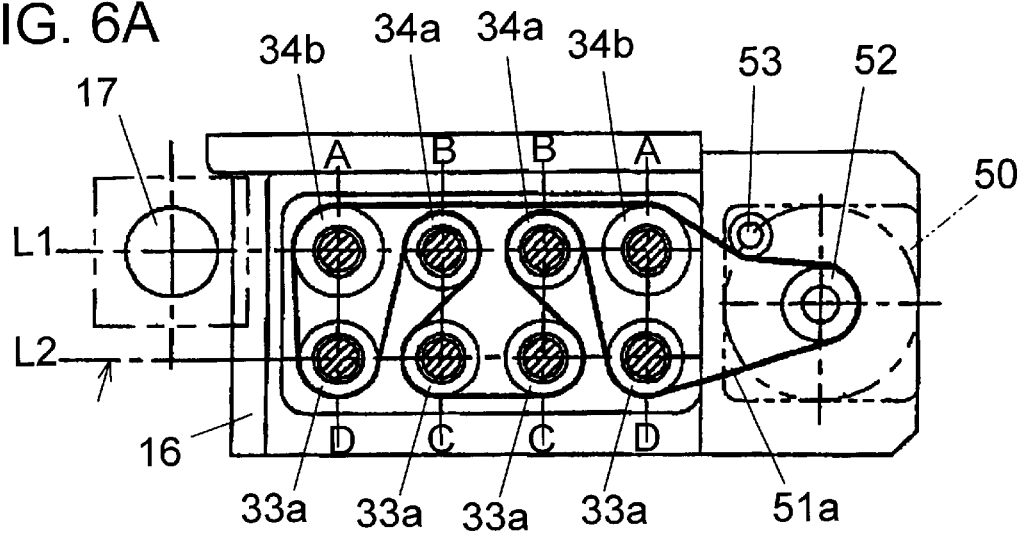
FIGS. 6A to 6C are fragmentary details of the transfer head shown in FIG. 2.
Figure 6B:
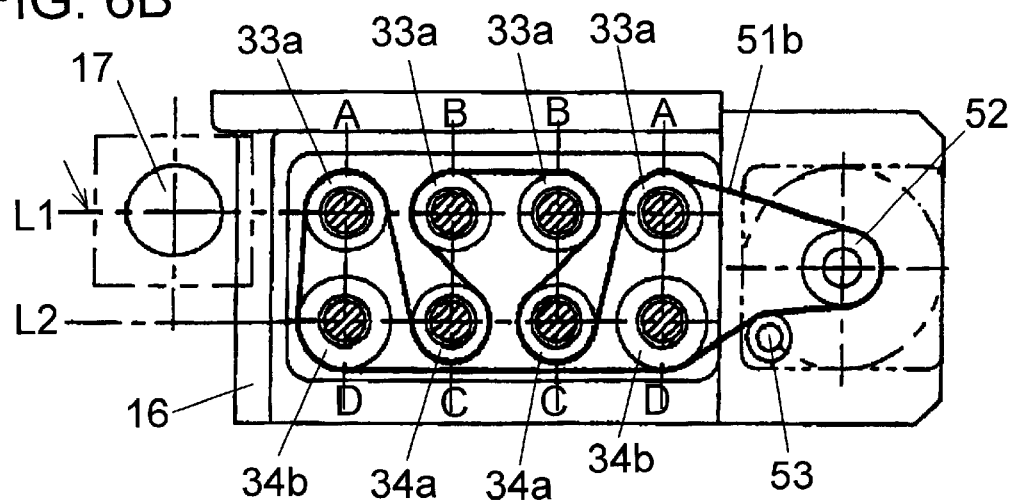
Figure 6C:
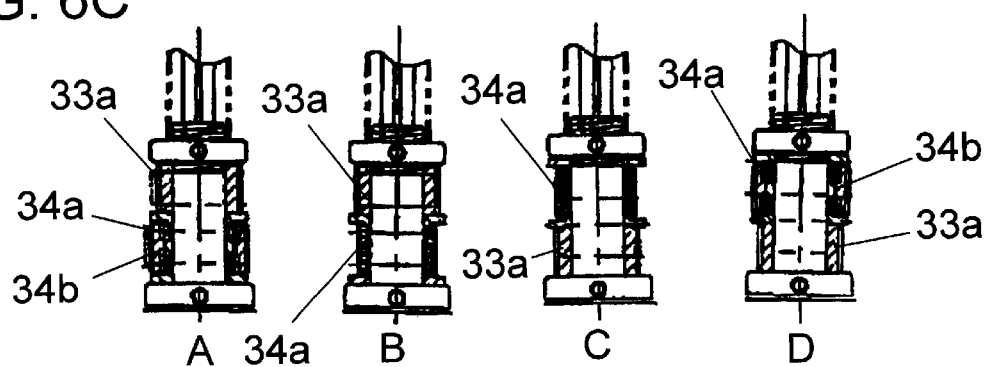
Figure 7:
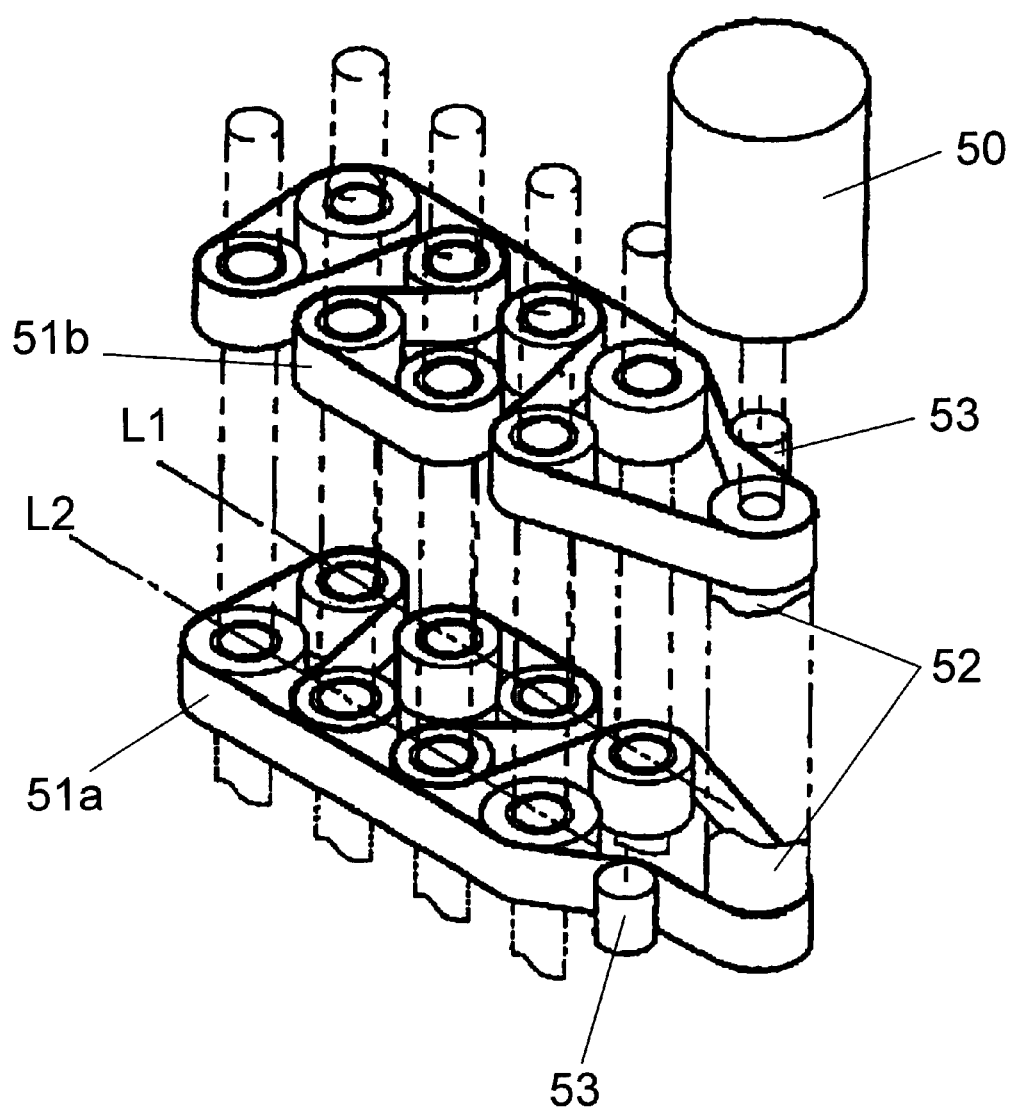
FIG. 7 is a perspective view of the transfer head shown in FIG. 2.

Next described is position of nozzle rotation motor 50 for rotating nozzle lines and suction nozzles in each nozzle line of transfer head 9. FIGS. 6A to 6C are partial sectional views of the transfer head shown in FIG. 2. FIG. 7 is a fragmentary perspective view of the same part.

As shown in FIGS. 6A to 6C and FIG. 7, transfer head 9 is provided with first nozzle line L1 and second nozzle line L2, and each line has four suction nozzles aligned along the X direction as illustrated in FIG. 1. In first nozzle line L1 and second nozzle line L2, the line near to component feeder carriage 4 is named L1, and the line near to board 3 is named L2. Nozzle rotation motor 50 is disposed centrally with respect to Lines L1 and L2. This motor 50 is a single θ-axis rotation driving device for rotating suction nozzles in each nozzle line on the nozzle shaft.

Motor 50 rotates each nozzle line via one of two endless belts 51*a* and 51*b* set in two vertical stages depending on pulley position (transmission pulley 33 and idler pulley sections 34) of shaft rotor 32 as shown in FIG. 7. More specifically, as shown in FIGS. 6A and 7, lower belt 51*a* rotates four suction nozzles in line L2, and as shown in FIGS. 6B and 7 upper endless belt 51*b* rotates four suction nozzles in line L1 through transmission pulley 33*a*. Tension pulley 53 is provided to both upper and lower stages for adjusting belt tension.

Next, type of shaft rotor 32 of each suction nozzle unit 12 is described. As shown in FIG. 6C, there are four types A, B, C, and D for the combination of transmission pulley section 33 and idler pulley section 34 in shaft rotor 32. Each of nozzle lines L1 and L2 is aligned by a combination of these four types. In other words, Type A means pulley 33*a* at the upper stage and pulley 34*b* at the lower stage through bearing 34*a*. Type B means pulley 33*a* at the upper stage and only bearing 34*a* is attached to the lower stage. Types C and D are the opposite of Types B and A.

In the example shown in FIGS. 6A and 6B, the above types A to D are used in the next sequence: Line L1 (A, B, B, A) and Line L2 (D, C, C, D).

By adopting this structure and alignment for shaft rotor 32, transmission pulley 33*a* attached to each shaft of the nozzle line to be rotated contacts endless belts 51*a* and 51*b* on its teeth side. Shaft rotor 32 of the nozzle line which is not rotated may be used as an idler for the belt guide. Here, only pulley 34*b* is used for the position guided by belts 51*a* and 51*b* at the teeth side, and only bearing 34*a* at the guided position at the back side. It is apparent from FIGS. 6A and 6B that alignment of the transmission pulley and idler pulley sections on the upper and lower stages is symmetrical, so that belts 51*a* and 51*b* with the same length may be used for both upper and lower stages, simplifying the control of service parts for the belts.

As described above, nozzle shafts for two or more suction nozzles in the same nozzle line are rotated using one endless belt. This enables θ-axis rotation driving with small rotation transmission error and high accuracy. In addition, a compact multi-nozzle transfer head is achievable. In the above configuration, nozzle rotation motor 50, which is the θ-axis rotation driving device, is disposed at the midpoint of the nozzle lines. This assures symmetrical transmission, and minimizes momentum at the part of transfer head 9 protruding from X table 6. Oscillation during driving is thus suppressed, enabling high speed driving.

Next, the position of board recognition camera 17 in transfer head 9 is described.

As shown in FIGS. 6A and 6B, head 9 is equipped with camera 17 and the two move integrally together. Camera 17 is disposed in line with the nozzle line near to feeder carriage 4, i.e., first nozzle line L1. Camera 17 moves horizontally and integrally with head 9 when X table 6 and Y table 7 are driven, and captures an image of board 3 positioned on rail 2 to recognize the position of board 3. In other words, camera 17 is an image-capturing device for taking the image of board 3. Disposition of camera 17 as described above has the advantage described later during capture of the image of board 3 when driven by Y table 7 which moves camera 17 in the Y direction.

Mounting operation of the preferred embodiment of the present invention as configured above is described next.

First, calibration conducted at startup and maintenance of the mounter is described. Calibration is carried out with respect to each mounting point on board 3 to identify in advance the difference between the position set in the control data and the actual position of transfer head 9 when actually driving X table 6 and Y table 7 based on this control data.

Figure 8A:
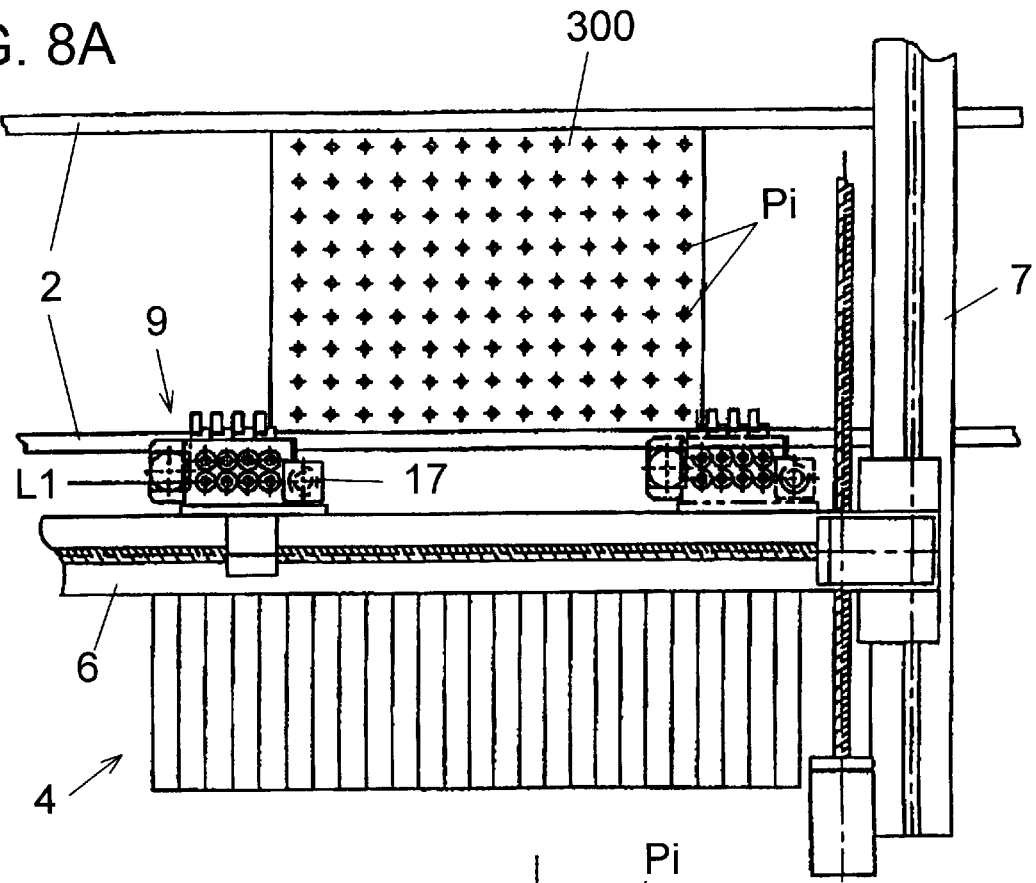
FIGS. 8A to 8C illustrate calibration in a component mounting method in accordance with the preferred embodiment of the present invention.

For calibration, a calibration board is used on which measuring points for calibration are aligned with high positional accuracy on a grid. Board recognition camera 17 moves and captures these measuring points on the calibration board to create calibration data for X table 6 and Y table 7. More specifically, as shown in FIG. 8A, calibration board 300 is placed on rail 2. Then, X table 6 and Y table 7 are driven to move camera 17 over board 300 secured at a predetermined position, and the position of each measuring point Pi is captured to identify the measuring point Pi position.

Figure 8B:
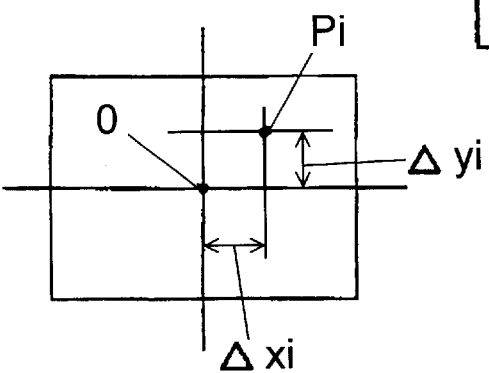

In the above operation, movement of camera 17 is controlled in a way that its origin 0 of optical coordinates coincides with the center of measuring point Pi in the control data. However, origin 0 does not always coincide with the center of measuring point Pi according to the positional recognition result of the camera due to the mechanical errors in X table 6 and Y table 7. For example, as shown in FIG. 8B, positional deviation xi and yi with respect to origin 0 of the optical coordinates are detected at measuring point Pi on board 300. This positional deviation is generally caused by mechanical errors in X table 6 and Y table 7, and shows a unique value for each point in the movement area. Accordingly, this positional deviation is previously identified as a unique positional error at each point to compensate for each positional error at each mounting point during mounting operation so as to ensure mounting in the correct position.

When camera 17 captures the image of each measuring point Pi in the above calibration, the movement area in the Y direction for capturing measuring point Pym and movement area during mounting operation to the actual furthest point in the Y direction coincide, because camera 17 is disposed in line with first nozzle line L1 as described above. The pitch error of feeding screw 8Y over the entire movement area during mounting operation is thus detectable.

Figure 8C:
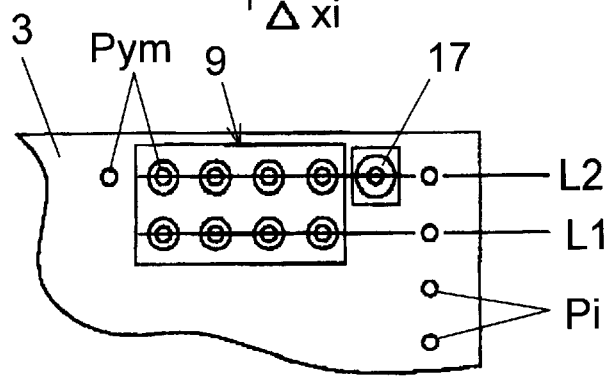

FIG. 8C shows the calibration when camera 17 is disposed on second nozzle line L2 of transfer head 9 for reference. In this case, camera 17 is unable to cover Y movement area required for moving to the actually required movement area of feeding screw 8Y, that is the farthest end of board 3 in the Y direction for first nozzle line L1 (mounting point near measuring point Pym), even camera 17 is positioned on measuring point Pym. Complete calibration data for Y axis is thus not obtainable.

As shown in the preferred embodiment, this case does not occur when camera 17 is disposed in line with first nozzle line L1. In other words, a complete set of calibration data covering the entire required area is obtainable by disposing camera 17 as shown in the preferred embodiment. The position of camera 17 is not required to be precisely on first nozzle line L1. It is apparent that some positional deviation to the extent that there is no obstacle to positional recognition in the viewing field is acceptable in the present invention. Camera 17 may be disposed to the side of the head attachment base from first nozzle line L1. After calibration, mounting starts.

Next, attachment of the suction tool is described.

Different types of suction tools suited for applicable components are attached to transfer head 9 of the mounter for mounting components with different shapes and sizes. Transfer head 9 of the mounter in the preferred embodiment allows the combination of a range of suction tools for applicable components shown in FIGS. 9A to 9C and FIGS. 10A to 10C.

FIG. 9A shows the case of attaching suction tool 38 for the most common and same type components to the nozzle head of all suction nozzle units. FIGS. 9B and 9C show how four types of components P1, P2, P3, and P4 are held with transfer head 9 with suction nozzles aligned in a way shown in FIG. 9A. Although a large component P2 protruding from the area of one suction tool 38 is present, as shown in the Figure, simultaneous vacuum holding is possible as long as the components held with adjacent suction tools 38 (components P1, P3) are not positionally interfered.

FIGS. 10A to 10C show cases of attaching different types of suction tools to transfer head 9. More specifically, in FIG. 10A, two ordinary suction tools 38 and two suction tools 380 for large components are attached at alignment pitch 2P in four nozzle heads in each line. In FIG. 10B, ordinary suction tool 38 and suction tool 380 for large components are attached at alignment pitches P and 3P respectively. Furthermore, suction tool 380 for large components is attached to one nozzle head in first nozzle line L1 in FIG. 10C.

In these examples, suction tools are not attached to adjacent nozzle heads in the X and Y directions when suction tool 380 for large components is required to be attached. This enables the attachment of suction tool 380 without causing any positional interference with the reflector of suction tool 380 and other suction tools.

For mounting multiple types of components, combinations other than those shown in FIGS. 9A to 9C and FIGS. 10A to 10C are possible. A wide variety of combinations is thus available: multiple suction nozzles with different sizes for vacuum-holding components may be aligned in the X direction at a basic pitch P specified by suction nozzle unit 12 or simple multiples of basic pitch P. The component mounter and mounting method of the present invention thus allow the transfer of electronic components of different types using the same mounting turn, thus improving the mounting efficiency.

Next, the mounting method is described.

As described above, suction tools suitable for applicable components to be mounted are attached to transfer head 9. After this attachment operation, mounting starts.

First, in FIG. 1, transfer head 9 is moved to component feeder carriage 4, and suction tool 38 picks up a component from each tape feeder 5.

Here, simultaneous pickup by vacuum is possible when the alignment of each type of component in tape feeder 5 of feeder carriage 4 matches with the alignment of suction tool 38 in transfer head 9. In this case, suction tools 38 in multiple suction nozzle units 12 are lowered at the same time to simultaneously pick up multiple components. In other cases, a suction tool suited to a specific component individually picks up in accordance with mounting sequence data. After the components are picked up by one nozzle line, another nozzle line picks up the next set of components. For example, after first nozzle line L1 at the feeder carriage 4 side picks up components, second nozzle line L2 at the board 3 side picks up the next set of components. Or, second nozzle line L2 may pick up components first, and then first nozzle line L1 may pick up the next set of components. The travel of transfer head 9 during the pickup operation may be minimized by shortening the distance in the X direction of transfer head 9 in the above component pickup operation, thus reducing mounting tact time. In addition, the smaller cumulative pitch error between multiple suction nozzles of head 9 minimizes the occurrence of defective pickups caused by positional deviation between the suction nozzle and component. As a result, simultaneous pickup performance may be improved in comparison to a series nozzle transfer head with multiple suction nozzles disposed in a single line.

Head 9 holding multiple components moves over board 3 by means of X table 6 and Y table 7. In this movement route, head 9 passes over line camera 10 at a predetermined movement speed. This allows camera 10 to capture the image of components held by head 9 from underneath, process the captured image, and recognize each component.

Components revealed to show positional deviation are mounted at each mounting point on board 3 after their positional deviation is compensated. In this mounting operation, suction tools 38 holding these components are lowered at the same time when the pitch of components held, i.e., the alignment pitch of suction nozzle unit 12 and mounting point pitch on board 3, match. In other cases, suction tools holding components are sequentially lowered based on mounting sequence data for mounting components at each mounting point.

The present invention as described above employs a transfer head in which multiple nozzle lines respectively having multiple suction nozzles which vacuum-hold components are aligned at a predetermined basic pitch along the parts feeders' alignment direction. This allows the mounter to be made more compact, and also improves the simultaneous pickup performance of multiple components, enabling components to be mounted with higher efficiency.

The present invention employs an image-capturing device disposed approximately in line with a nozzle line at the feeder carriage side or at nearer to the head attachment base side from the nozzle line. The image-capturing device is moved by a moving device for the transfer head, in which multiple nozzle lines having multiple suction nozzles are aligned at a predetermined basic pitch alongside parts feeders, so as to capture the image of the calibration board. This enables to capture the entire applicable calibration area for creating the complete set of calibration data.

The present invention also employs the transfer head in which multiple nozzle lines having multiple suction nozzles for vacuum-holding components with different sizes is provided. These suction nozzles are aligned at a predetermined basic pitch or simple multiple of basic pitch alongside the parts feeders. This broadens the types of components to be mounted using the same mounter, increasing the component mounting efficiency.

What is claimed is:

1. A component mounter comprising:
    (a) a plurality of parts feeders aligned in a component feeder carriage;
    (b) a transfer head for picking up a component from said parts feeders and mounting it on a board, and said transfer head having a plurality of suction nozzles for vacuum-holding said component; and
    (c) a camera for capturing an image of said board by integrally moving with said transfer head, said camera being disposed at one of approximately in line with a nozzle line near to said component feeder carriage in said plurality of nozzle lines, and nearer to a head attachment base side from said nozzle line;
    wherein said suction nozzles are aligned at a predetermined basic pitch, alongside said parts feeders, in a plurality of nozzle lines.

2. The component mounter as defined in claim 1, wherein the alignment direction of said plurality of nozzle lines is perpendicular to the alignment direction of said suction nozzles in each of said nozzle lines.

3. The component mounter as defined in claim 1 further comprising a nozzle elevation motor for elevating each of said plurality of suction nozzles independently at variable stroke.

4. The component mounter as defined in claim 1 further comprising a single rotation driver for rotating said plurality of suction nozzles on each nozzle shaft.

5. The component mounter as defined in claim 4, wherein said rotation driver is disposed at the midpoint of said plurality of nozzle lines.

6. The component mounter as defined in claim 4, wherein said rotation driver rotates said suction nozzles line by line via a belt.

7. A component mounter comprising:

(a) a plurality of parts feeders aligned in a component feeder carriage; and (b) a transfer head for picking up said component from said parts feeders and mounting it on a board, and said transfer head having a plurality of suction nozzles for vacuum-holding said component;

wherein said suction nozzles include those of different sizes; and said suction nozzles are disposed at least at one of a predetermined basic pitch and simple multiple of basic pitch, and aligned alongside said parts feeders in a plurality of nozzles lines.

* * * * *